US012787394B2

(12) United States Patent
Nagata et al.

(10) Patent No.: US 12,787,394 B2
(45) Date of Patent: Nov. 3, 2026

(54) METHOD OF MANUFACTURING SILICON CARBIDE SEMICONDUCTOR DEVICE AND SILICON CARBIDE SEMICONDUCTOR DEVICE

(71) Applicants: FUJI ELECTRIC CO., LTD., Kawasaki (JP); DENSO CORPORATION, Kariya-city (JP)

(72) Inventors: Naruhisa Nagata, Matsumoto-city (JP); Yoshiyuki Sugahara, Yamagata-mura (JP); Masanobu Iwaya, Matsumoto-city (JP); Tomohiro Mimura, Kariya-city (JP); Kensuke Hata, Kariya-city (JP)

(73) Assignees: FUJI ELECTRIC CO., LTD., Kawasaki (JP); DENSO CORPORATION, Kariya-city (JP)

( * ) Notice: Subject to any disclaimer, the term of this patent is extended or adjusted under 35 U.S.C. 154(b) by 294 days.

(21) Appl. No.: 18/676,897

(22) Filed: May 29, 2024

(65) Prior Publication Data

US 2025/0006795 A1 Jan. 2, 2025

(30) Foreign Application Priority Data

Jun. 30, 2023 (JP) ................................ 2023-108641

(51) Int. Cl.
*H01L 29/16* (2006.01)
*H01L 29/45* (2006.01)
(Continued)

(52) U.S. Cl.
CPC ....... *H10D 62/8325* (2025.01); *H10D 12/031* (2025.01); *H10D 64/62* (2025.01); *H10D 64/664* (2025.01)

(58) Field of Classification Search
CPC ............... H10D 30/668; H10D 12/032; H10D 62/8325; H10D 64/62; H10D 64/664
See application file for complete search history.

(56) References Cited

U.S. PATENT DOCUMENTS

2016/0163806 A1 6/2016 Nishimura
2017/0271486 A1 9/2017 Komatsu et al.
(Continued)

FOREIGN PATENT DOCUMENTS

JP 2016-111135 A 6/2016
JP 2017-168684 A 9/2017
(Continued)

OTHER PUBLICATIONS

Office Action issued for corresponding Japanese Patent Application No. 2023-108641, and its English translation. dated Jul. 7, 2026.

*Primary Examiner* — David C Spalla
(74) *Attorney, Agent, or Firm* — Rabin & Berdo, P.C.

(57) ABSTRACT

A method of manufacturing a silicon carbide semiconductor device includes preparing a silicon carbide semiconductor substrate in which, on a front surface of a starting substrate of a first conductivity type, a first semiconductor layer of the first conductivity type is provided, the first semiconductor layer having an impurity concentration lower than an impurity concentration of the starting substrate. Next, at the surface of the first semiconductor layer, a second semiconductor layer of a second conductivity type is formed. Next, at the surface of the second semiconductor layer, an ohmic electrode is formed. Next, at the surface of the ohmic electrode, a Ti film and a TiN film are sequentially deposited to form a barrier metal. Next, the barrier metal is subjected to a heat treatment to form an annealed barrier metal. The heat treatment is performed in a range of 550 degrees C. to 750 degrees C.

10 Claims, 10 Drawing Sheets

(51) Int. Cl.

| | |
|---|---|
| ***H01L 29/49*** | (2006.01) |
| ***H01L 29/66*** | (2006.01) |
| ***H10D 12/01*** | (2025.01) |
| ***H10D 62/832*** | (2025.01) |
| ***H10D 64/62*** | (2025.01) |
| ***H10D 64/66*** | (2025.01) |

(56) References Cited

U.S. PATENT DOCUMENTS

2018/0294350 A1* 10/2018 Utsumi ................ H10D 12/031
2022/0102515 A1* 3/2022 Wang ................... H10D 64/513
2023/0238442 A1* 7/2023 Joshi .................. H10D 62/8325
257/734

FOREIGN PATENT DOCUMENTS

JP 2018-182032 A 11/2018
JP 2023005683 A 1/2023
WO 2007/094044 A1 8/2007

* cited by examiner

METHOD OF MANUFACTURING SILICON CARBIDE SEMICONDUCTOR DEVICE AND SILICON CARBIDE SEMICONDUCTOR DEVICE

CROSS REFERENCE TO RELATED APPLICATIONS

This application is based upon and claims the benefit of priority of the prior Japanese Patent Application No. 2023-108641, filed on Jun. 30, 2023, the entire contents of which are incorporated herein by reference.

BACKGROUND OF THE INVENTION

1. Field of the Invention

Embodiments of the invention relate to a method of manufacturing a silicon carbide semiconductor device and a silicon carbide semiconductor device.

2. Description of the Related Art

Silicon carbide (SiC) is expected to replace silicon (Si) as a next-generation semiconductor material. Compared to a conventional semiconductor device element that uses silicon as a semiconductor material, a semiconductor device that uses silicon carbide as a semiconductor material (hereinafter, silicon carbide semiconductor device) has various advantages such as enabling resistance of a device in an ON state to be reduced to a few hundredths and application under higher temperature (200 degrees C. or higher) environments. These advantages are due to characteristics of the material itself in that a bandgap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A structure of a conventional silicon carbide semiconductor device is described taking a trench-type MOSFET as an example. In the trench-type MOSFET, at a front surface of an $n^+$-type starting substrate, an $n^+$-type buffer layer and an n-type silicon carbide epitaxial layer are deposited. The n-type silicon carbide epitaxial layer has a first surface and a second surface opposite to each other, the second surface facing the $n^+$-type starting substrate, and at the first surface, an n-type high-concentration region is provided. Further, the n-type high-concentration region has a first surface and a second surface opposite to each other, the second surface facing the $n^+$-type starting substrate, and at the first surface of the n-type high-concentration region, a first $p^+$-type base region is selectively provided. In the n-type high-concentration region, a second $p^+$-type base region is selectively provided so as to underlie an entire bottom of a trench.

A conventional trench-type MOSFET further has a p-type base region, an $n^+$-type source region, a $p^{++}$-type contact region, a gate insulating film, a gate electrode, an interlayer insulating film, an ohmic electrode (source electrode), a back electrode, a trench, a source electrode pad, and a drain electrode pad. The ohmic electrode is provided on the $n^+$-type source region and the $p^{++}$-type contact region and the source electrode pad is provided on the ohmic electrode.

Further, for example, a barrier metal that prevents diffusion of metal atoms from the ohmic electrode to the gate electrode is provided intervening between the source electrode pad and, the ohmic electrode and the interlayer insulating film. The ohmic electrode, the barrier metal, and the source electrode pad are formed as follows by a process for forming a front electrode of a silicon carbide semiconductor device. First, nickel (Ni) deposited on the $n^+$-type source region and the $p^{++}$-type contact region is annealed, thereby forming the ohmic electrode containing a nickel silicide (NiSi). Next, on the ohmic electrode, a barrier metal containing titanium (Ti) and titanium nitride (TiN) is deposited. Next, the barrier metal is exposed to the atmosphere once and thereafter, an aluminum (Al) film or an aluminum-silicon (Al—Si) film is deposited, thereby forming the source electrode pad. As described, after the barrier metal is deposited, the barrier metal is exposed to the atmosphere once, whereby a barrier property of the barrier metal is enhanced.

Further, according to a known method of manufacturing a silicon carbide semiconductor device, a contact electrode containing a Ni silicide is formed and thereafter, a Ti film, a TiN film, and a Ti film are sequentially deposited on the contact electrode, thereby forming a barrier metal and next, a source electrode constituted by an Al—Si film is deposited (for example, refer to Japanese Laid-Open Patent Publication No. 2018-182032).

Further, according to a known method of manufacturing of a silicon carbide semiconductor device, a Ti film, a TiN film, and a Ti film are sequentially stacked on an entire surface by, for example, a sputtering method, a predetermined heating treatment (sintering) is performed, a barrier metal layer is formed, and an Al—Si alloy film is formed (for example refer to Japanese Laid-Open Patent Publication No. 2016-111135).

Further, according to a known method of manufacturing of a silicon carbide semiconductor device, a titanium nitride is formed along an inner wall of a contact hole and a surface of an interlayer insulating film by, for example, a sputtering method; a first nickel film is formed along the inner wall of the contact hole and a surface of the titanium nitride film, and a rapid heat treatment is performed, whereby crystal grains of the titanium nitride film become enlarged, whereby nickel from the first nickel film on the titanium nitride film may be suppressed from penetrating between column-shaped crystal grains of the titanium nitride film (for example, refer to Japanese Laid-Open Patent Publication No. 2017-168684).

SUMMARY OF THE INVENTION

According to an embodiment of the present invention, a method of manufacturing a silicon carbide semiconductor device, includes: preparing a silicon carbide semiconductor substrate having a first main surface and a second main surface opposite to each other, the silicon carbide semiconductor substrate having: a starting substrate of a first conductivity type, the starting substrate having a first surface and a second surface opposite to each other, the second surface constituting the second main surface of the silicon carbide semiconductor substrate, and a first semiconductor layer of the first conductivity type, provided at the first surface of the starting substrate and having an impurity concentration lower than an impurity concentration of the starting substrate, the first semiconductor layer having a first surface and a second surface opposite to each other, the second surface of the first semiconductor layer facing the starting substrate; forming a second semiconductor layer of a second conductivity type, at the first surface of the first semiconductor layer; forming an ohmic electrode at a surface of the second semiconductor layer; forming a barrier metal by depositing a titanium (Ti) film and subsequently a titanium nitride (TiN) film at a surface of the ohmic electrode; performing a heat treatment on the barrier metal at a temperature in a range of 550 degrees C. to 750 degrees C. to form an annealed barrier metal; forming a surface electrode at a surface of the annealed barrier metal; and forming a back electrode at the second main surface of the silicon carbide semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
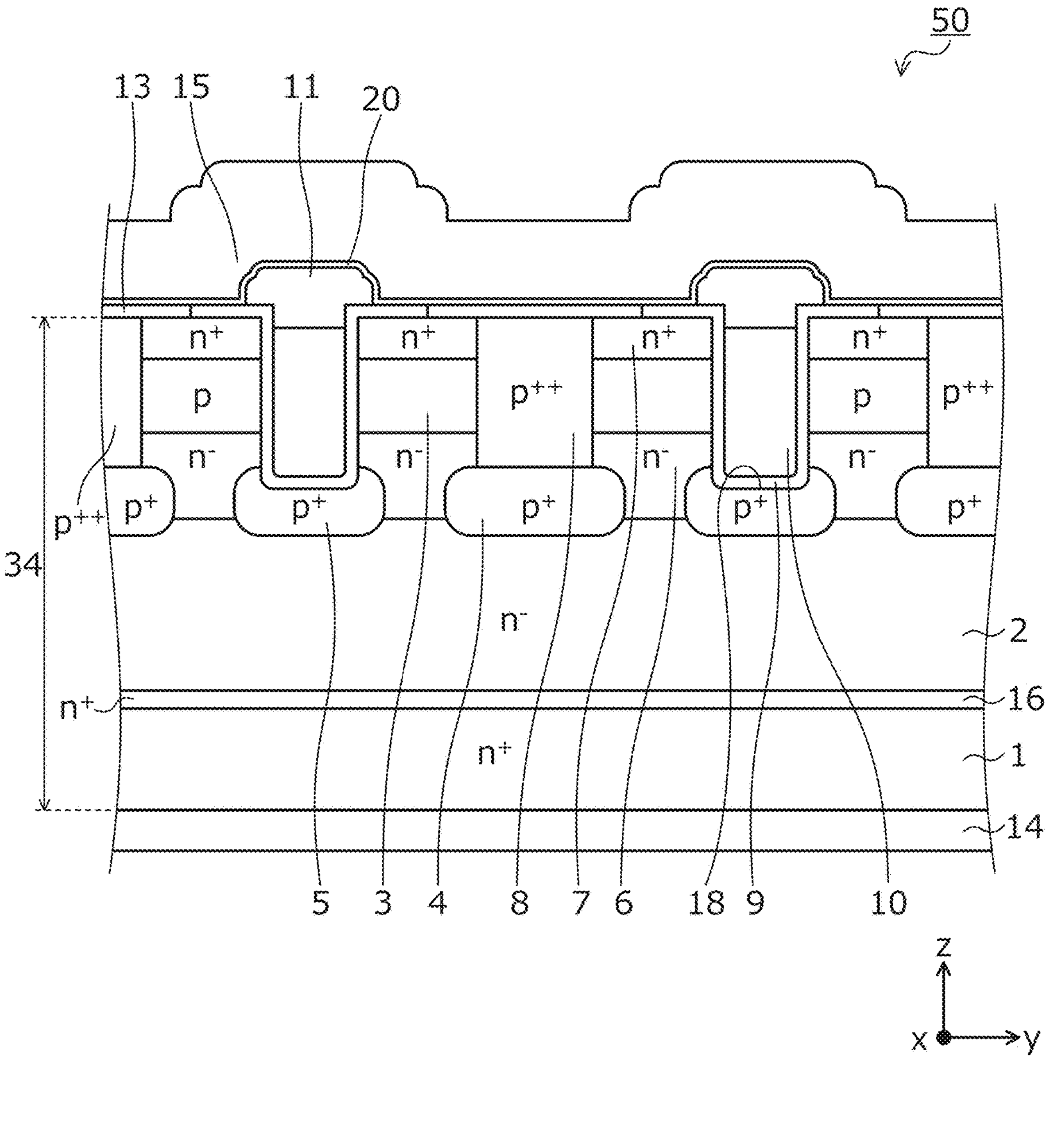
FIG. 1 is a cross-sectional view depicting a structure of a silicon carbide semiconductor device according to an embodiment.

First, problems associated with the conventional techniques are discussed. As described above, conventionally, to enhance the barrier property of a barrier metal, after a barrier metal containing Ti and TiN is deposited, the barrier metal is exposed to the atmosphere once and thereafter, an Al film or an Al—Si film is deposited. However, with this method, a problem arises in that the barrier property of the barrier metal is insufficient and Ni of the ohmic electrode, which contains NiSi and is below the barrier metal, passes through the barrier metal and seeps to the Al film or the Al—Si film.

Embodiments of a method of manufacturing a silicon carbide semiconductor device and a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention contains a wide band gap semiconductor. In an embodiment, a silicon carbide semiconductor device manufactured using, for example, silicon carbide (SiC) as the wide band gap semiconductor is described taking a trench-type MOSFET 50 as an example. FIG. 1 is a cross-sectional view depicting a structure of the silicon carbide semiconductor device according to the embodiment. In FIG. 1, only an active region through which a main current of the trench-type MOSFET 50 passes is depicted.

As depicted in FIG. 1, in the silicon carbide semiconductor device according to the embodiment, an $n^+$-type buffer layer 16 and a first $n^-$-type silicon carbide epitaxial layer (first semiconductor layer of a first conductivity type) 2 are stacked on a first main surface (front surface), for example, a (0001)-plane (Si-face), of an $n^+$-type starting substrate 1.

The $n^+$-type starting substrate 1 is a single crystal silicon carbide substrate doped with, for example, nitrogen (N). The $n^+$-type buffer layer 16 is, for example, a highly doped layer having a thickness of 1 μm or more but not more than 5 μm and is doped with a high concentration of nitrogen in a range of $1\times10^{17}/cm^3$ to $1\times10^{18}/cm^3$. The $n^+$-type buffer layer 16 promotes recombination of holes from the first $n^-$-type silicon carbide epitaxial layer 2, controls the concentration of hole reaching the $n^+$-type starting substrate 1, and suppresses an occurrence of stacking faults and expansion of the area of stacking faults.

The first $n^-$-type silicon carbide epitaxial layer 2 is a low-concentration $n^-$-type drift layer doped with, for example, nitrogen and having an impurity concentration lower than an impurity concentration of the $n^+$-type starting substrate 1. The first $n^-$-type silicon carbide epitaxial layer 2 has a first surface and a second surface opposite to each other, the second surface facing the $n^+$-type starting substrate 1, and at the first surface of the first $n^-$-type silicon carbide epitaxial layer 2, a second $n^-$-type silicon carbide layer 6 is formed. The second $n^-$-type silicon carbide layer 6 is a high-concentration $n^-$-type drift layer doped with, for example, nitrogen and having an impurity concentration lower than the impurity concentration of the $n^+$-type starting substrate 1 but higher than the impurity concentration of the first $n^-$-type silicon carbide epitaxial layer 2. Hereinafter, the $n^+$-type starting substrate 1, the first $n^-$-type silicon carbide epitaxial layer 2, the second $n^-$-type silicon carbide layer 6, and a later-described p-type base layer 3 combined are regarded as a stacked silicon carbide semiconductor substrate.

At a second main surface (back surface, i.e., a back surface of the stacked silicon carbide semiconductor substrate) of the $n^+$-type starting substrate 1, a back electrode (drain electrode) is provided. The back electrode constitutes the drain electrode. At a surface of the back electrode, a drain electrode pad (back electrode) 14 is provided.

In the stacked silicon carbide semiconductor substrate, at a first main surface thereof (surface of the p-type base layer 3), a trench gate structure is formed. In particular, trenches 18 penetrate through an $n^+$-type source region 7 and the p-type base layer 3, from the first main surface of the stacked silicon carbide semiconductor substrate and reach the second $n^-$-type silicon carbide layer 6. Along an inner wall of each of the trenches 18, a gate insulating film 9 is formed at a bottom and sidewalls of the trench 18 and on the gate insulating film 9 in the trench 18, a gate electrode 10 is formed. The gate insulating film 9 insulates the gate electrode 10 from the first $n^-$-type silicon carbide epitaxial layer 2, the second $n^-$-type silicon carbide layer 6, and the p-type base layer 3. A portion of the gate electrode 10 may protrude toward a source electrode pad 15, from a top (side facing the source electrode pad 15) of the trench 18.

In the first $n^-$-type silicon carbide epitaxial layer 2 and the second $n^-$-type silicon carbide layer 6, first $p^+$-type regions 4 and second $p^+$-type regions 5 are selectively provided. The first $p^+$-type regions 4 reach deep positions closer to the drain electrode than are bottoms of the trenches 18. Lower ends (ends facing the drain electrode) of the first $p^+$-type regions 4 are positioned closer to the drain electrode than are the bottoms of the trenches 18. The first $p^+$-type regions 4 are provided between the trenches 18. As depicted in FIG. 1, while the first $p^+$-type regions 4 are in contact with later-described $p^{++}$-type contact regions 8, the first $p^+$-type regions 4 may be formed as to be apart from the $p^{++}$-type contact regions 8. In this instance, the first $p^+$-type regions 4 are further provided in the second $n^-$-type silicon carbide layer 6, at the surface of the second $n^-$-type silicon carbide layer 6, and upper surfaces of the first $p^+$-type regions 4 are in contact with the p-type base layer 3.

Lower ends of the second $p^+$-type regions 5 are positioned closer to the drain electrode than are the bottoms of the trenches 18. The second $p^+$-type regions 5 are formed at positions facing the bottoms of the trenches 18 in a depth direction z. A width of each of the second $p^+$-type regions 5 is wider than a width of each of the trenches 18. The bottoms of the trenches 18 may reach the second $p^+$-type regions 5 or may be positioned in the second $n^-$-type silicon carbide layer 6, apart from the second $p^+$-type regions 5 and intervening between the p-type base layer 3 and the second $p^+$-type regions 5. The first $p^+$-type regions 4 and the second $p^+$-type regions 5 are doped with, for example, aluminum (Al).

Portions of each of the first $p^+$-type regions 4 extend toward the trenches 18, thereby forming a structure in which the first $p^+$-type regions 4 are connected to the second $p^+$-type regions 5. In this instance, in a plan view of the device, said portions of the first $p^+$-type regions 4 have a layout in which the portions and the second $n^-$-type silicon carbide layer 6 repeatedly alternate with one another in a direction (hereinafter, a second direction) y orthogonal to a direction (hereinafter, a first direction) x in which the first $p^+$-type regions 4 and the second $p^+$-type regions 5 are arranged. In other words, in the orthogonal direction y, the first $p^+$-type regions 4 and the second $p^+$-type regions 5 suffice to be partially connected to one another at least at one location. As a result, holes generated during avalanche breakdown at joined portions of the first $n^-$-type silicon carbide epitaxial layer 2 and the second $p^+$-type regions 5 may be efficiently migrated to ohmic electrodes 13, thereby reducing load on the gate insulating films 9 and enhancing reliability.

At the first main surface of the first $n^-$-type silicon carbide epitaxial layer 2, the p-type base layer (second semiconductor layer of a second conductivity type) 3 is provided. An impurity concentration of the p-type base layer 3 is, for example, lower than an impurity concentration of the first $p^+$-type regions 4. As a result, even when the concentration of the p-type base layer 3 is reduced to reduce the threshold voltage, spreading of a depletion layer of the p-type base layer 3 is suppressed, whereby decreases in breakdown voltage due to punch-through may be avoided. The p-type base layer 3 has a first surface and a second surface, the second surface facing the $n^+$-type starting substrate 1, and in the p-type base layer 3, at the first surface thereof, the $n^+$-type source region 7 and the $p^{++}$-type contact regions 8 are selectively provided. Further, the $n^+$-type source region 7 and the $p^{++}$-type contact regions 8 are in contact with one another.

In FIG. 1, while only two trench MOS structures are depicted, MOS gate (insulated metal-oxide-semiconductor gate) structures of numerous trench structures may be further disposed in parallel.

An interlayer insulating film 11 is provided in an entire area of the first main surface of the stacked silicon carbide semiconductor substrate so as to cover the gate electrodes 10 embedded, respectively, in the trenches 18. The ohmic electrodes (the source electrodes) 13 are in contact with the $n^+$-type source region 7 and the $p^{++}$-type contact regions 8 via contact holes opened in the interlayer insulating film 11. The ohmic electrodes 13 are electrically insulated from the gate electrodes 10 by the interlayer insulating film 11. The source electrode pad (surface electrode) 15 is provided on the ohmic electrodes 13.

Further, for example, a barrier metal (annealed barrier metal) 20 that prevents diffusion of metal atoms from the ohmic electrodes 13 to the gate electrode 10 is provided intervening between the source electrode pad 15 and, the ohmic electrodes 13 and the interlayer insulating film 11. In the barrier metal 20, a Ti film and a TiN are sequentially deposited and thereafter are heat treated, whereby the Ti film is nitrided forming the TiN film.

Figure 2:
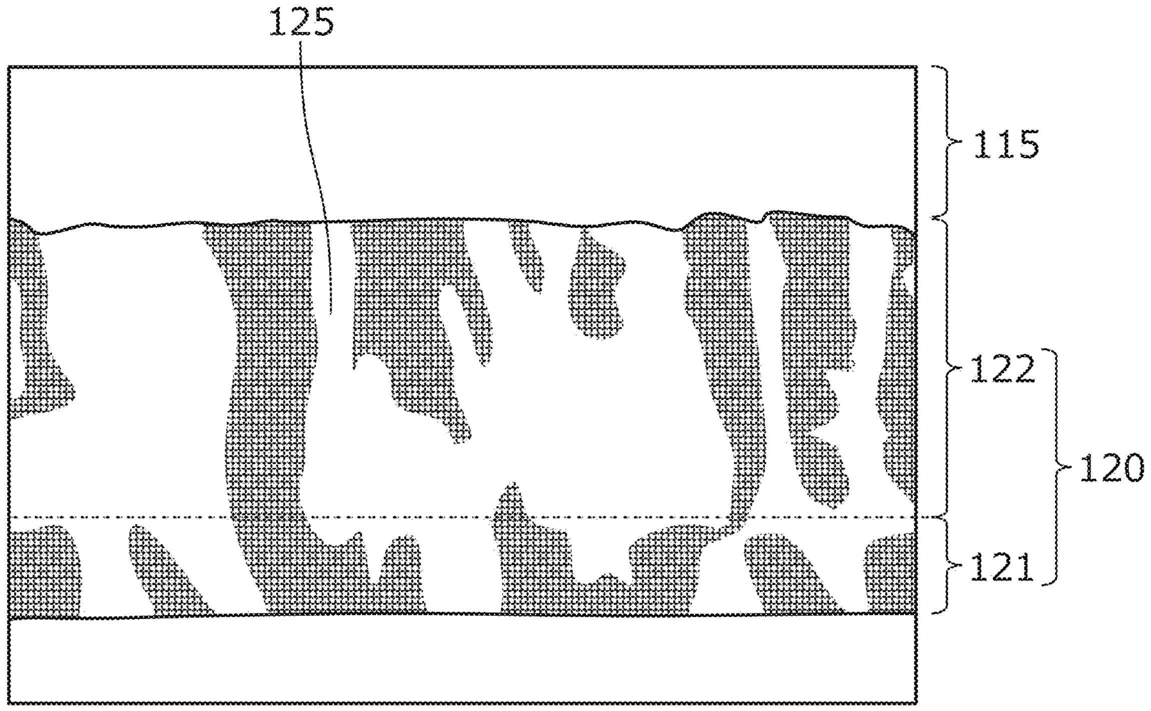
FIG. 2 is a cross-sectional view depicting results of observing a barrier metal of a conventional silicon carbide semiconductor device.
Figure 3:
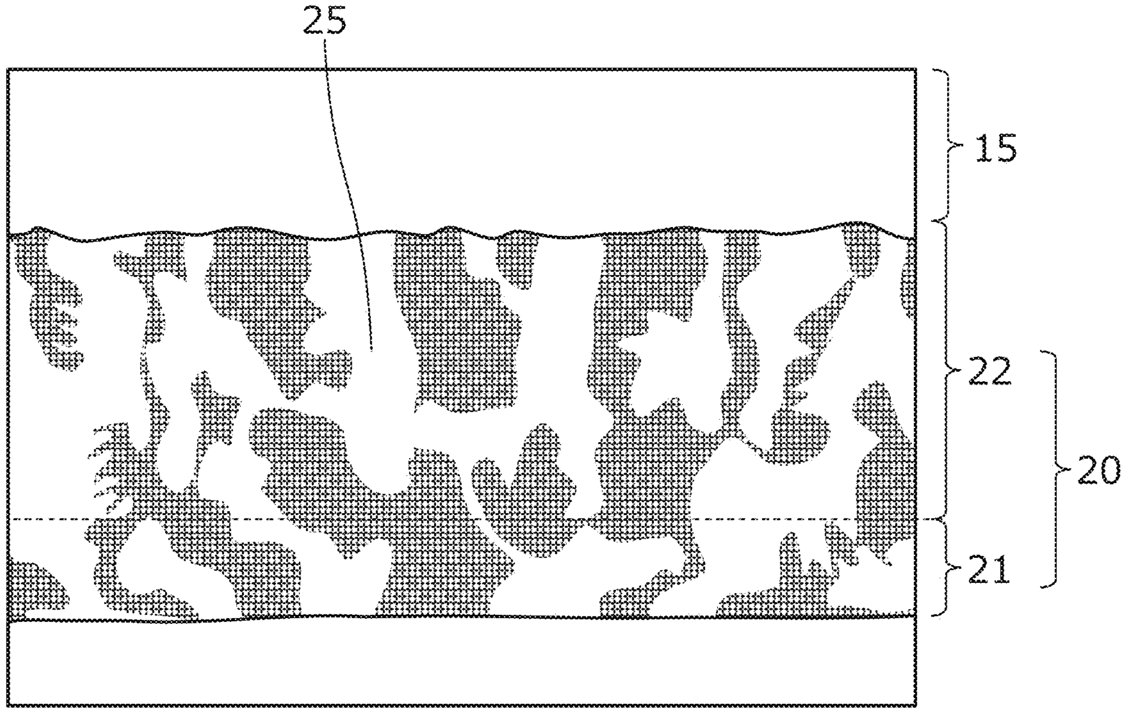
FIG. 3 is a cross-sectional view depicting results of observing a barrier metal of the silicon carbide semiconductor device according to the embodiment.

FIG. 2 is a cross-sectional view depicting results of observing the barrier metal of the conventional silicon carbide semiconductor device, i.e., barrier metal without annealing. FIG. 3 is a cross-sectional view depicting results of observing the barrier metal of the silicon carbide semiconductor device according to the embodiment. FIG. 2 depicts an instance in which a barrier metal (barrier metal without annealing) 120 constituted by a Ti film 121 having a thickness of about 20 nm and a TiN film 122 having a thickness of about 70 nm is deposited and thereafter, is exposed once to the atmosphere and subsequently, a source electrode pad 115 constituted by an Al film or an Al—Si film is deposited. As depicted in FIG. 2, the barrier metal 120 has a columnar structure constituted by columnar crystal grains grown in a direction orthogonal to the first main surface, at both the TiN film 122 and the Ti film 121; and in the TiN film 122, a grain boundary 125 in a direction from the surface of the TiN film 122 to the bottom of the TiN film 122 penetrates to the bottom of the TiN film 122 and reaches the surface of the Ti film 121.

In contrast, FIG. 3 depicts an instance in which by a method of manufacturing according to the embodiment, after the barrier metal (pre-annealing barrier metal) constituted by a Ti film 21 having a thickness of about 20 nm and a TiN film 22 having a thickness of about 70 nm is deposited, annealing at a temperature of 650 degrees C. is performed to form an annealed barrier metal 20 and thereafter, the source electrode pad 15 constituted by an Al film or an Al—Si film is deposited. As depicted in FIG. 3, the columnar structure of the barrier metal 20 is random; boundaries of the TiN film 22 and the Ti film 21 are not visible; in the TIN film 22, a grain boundary 25 in a direction from the surface of the TiN film 22 to the bottom of the TiN film 22 is blocked by other crystal grains and does not penetrate to the bottom of the TiN film 22. Further, while the TiN film 22 has a columnar structure, the Ti film 21 has a granular structure.

Figure 4:
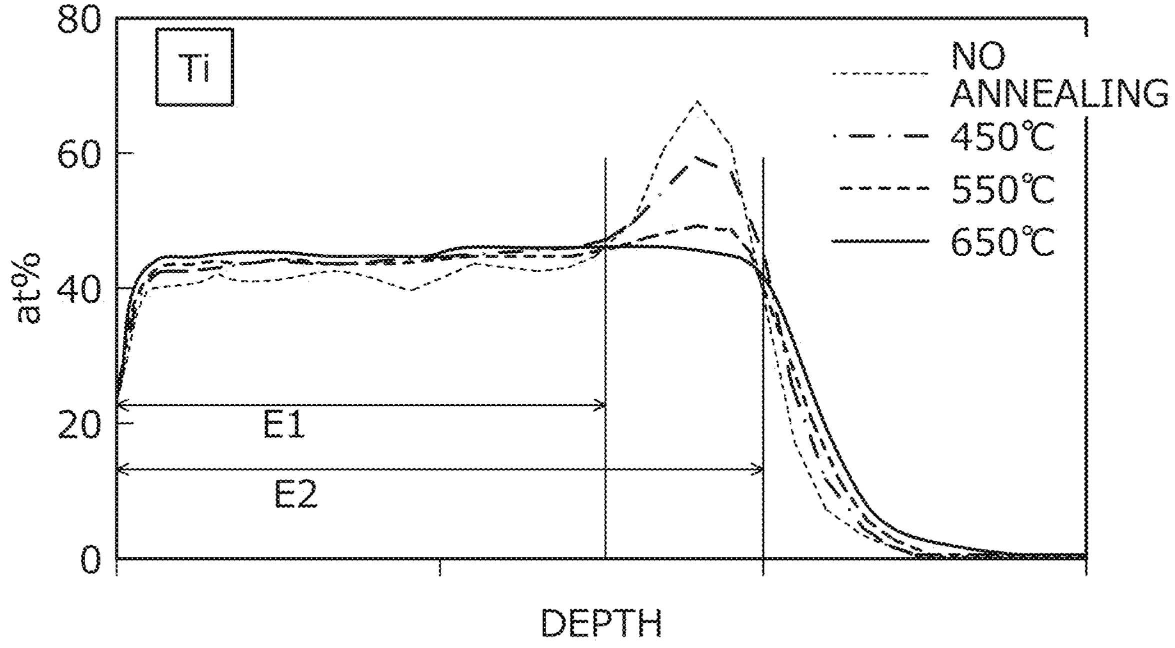
FIG. 4 is a graph showing concentrations of titanium when a temperature of annealing of the barrier metal in a conventional silicon carbide semiconductor device and the silicon carbide semiconductor device according to the embodiment is varied.

FIG. 4 is a graph showing concentrations of titanium when the temperature of annealing of the barrier metal (barrier metal without annealing) in a conventional silicon carbide semiconductor device and the silicon carbide semiconductor device according to the embodiment is varied. In FIG. 4, a vertical axis indicates the concentration of Ti in units of atomic percent (at %). A horizontal axis indicates depths from the surface of the barrier metal 20. FIG. 4 shows the concentration of Ti in an instance when no annealing treatment is performed (conventional) and instances when annealing treatments are performed, respectively, at 450 degrees C., 550 degrees C., and 650 degrees C., after a TiN film and a Ti film are deposited.

Figure 5:
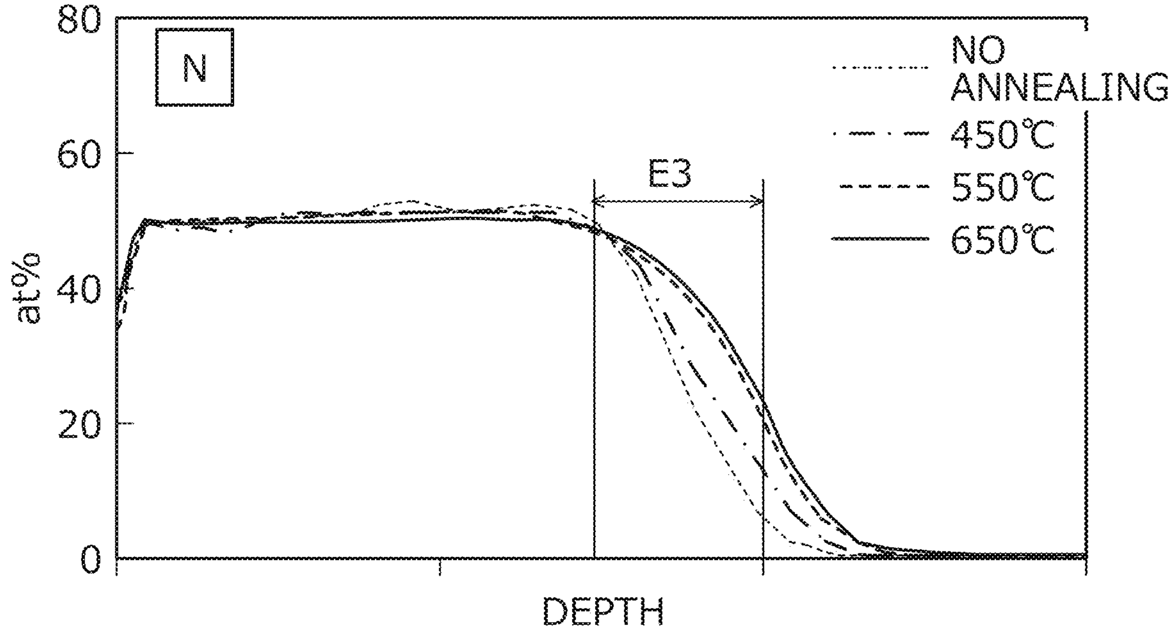
FIG. 5 is a graph showing concentrations of nitrogen when the temperature of annealing of the barrier metal in the conventional silicon carbide semiconductor device and the silicon carbide semiconductor device according to the embodiment is varied.

FIG. 5 is a graph showing concentrations of nitrogen when the temperature of annealing of the barrier metal in the conventional silicon carbide semiconductor device and the silicon carbide semiconductor device according to the embodiment is varied. In FIG. 5, a vertical axis indicates the concentration of N in units of at %. A horizontal axis indicates depths from the surface of the barrier metal 20. FIG. 5 shows the concentration of N in an instance when no annealing treatment is performed (conventional) and instances when annealing treatments are performed, respectively, at 450 degrees C., 550 degrees C., and 650 degrees C., after a TiN film and a Ti film are deposited.

As depicting in FIGS. 4 and 5, in the barrier metal (annealed barrier metal) 20, in a region constituted by the TiN film 22, the concentrations of Ti and N are nearly constant while in a region constituted by the Ti film 21, N diffuses and is converted into a nitride, whereby the concentration of N decreases in the depth direction from the surface of the Ti film 21. Further, in the instance when annealing is not performed and the instance when annealing is performed under the condition of 450 degrees C., the concentration of N is constant within a region (E1) where the concentration of Ti is uniform. On the other hand, in the instances of annealing under the conditions of 550 degrees C. and 650 degrees C., nitriding of only the Ti film 21 progresses and in a region (E2) where the concentration of Ti is uniform, there is a region (E3) where the concentration of N decreases. Further, at a position at about ½ of the thickness of the Ti film 21, the concentration of N is 30 at % or greater.

Figure 6:
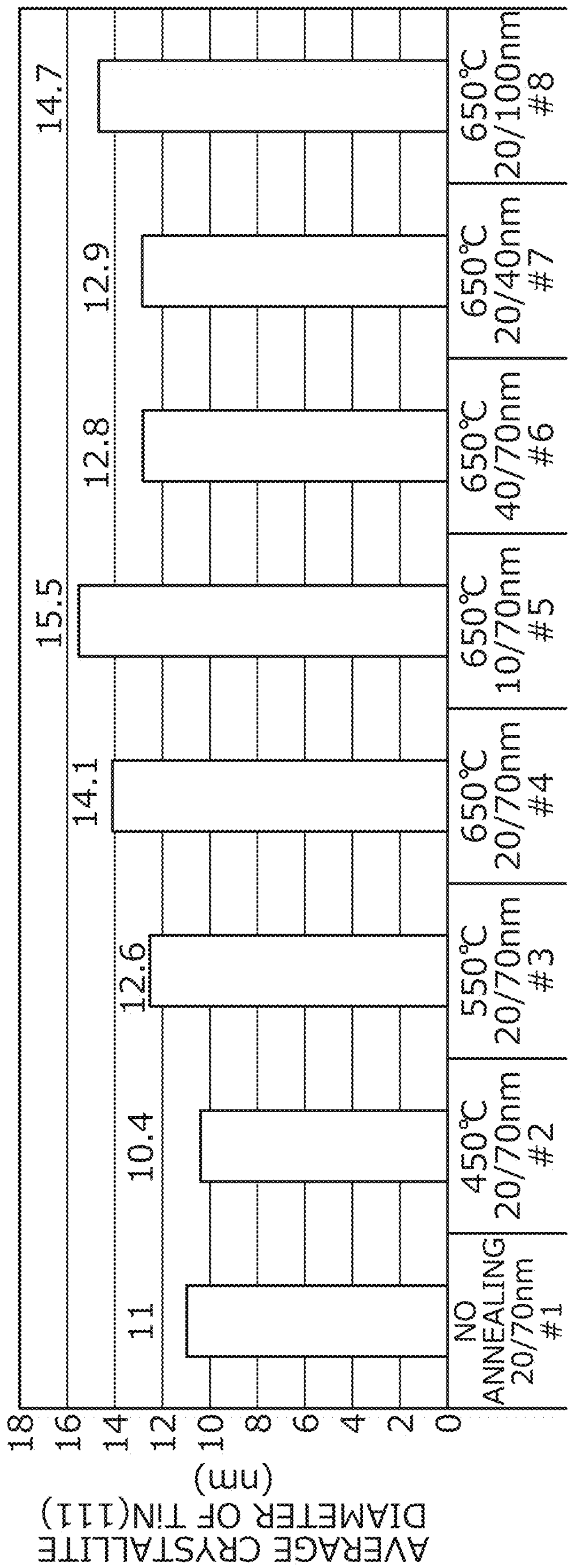
FIG. 6 is a graph showing average crystallite diameter of TiN (111) when the temperature of the annealing of the barrier metal in the conventional silicon carbide semiconductor device and the silicon carbide semiconductor device according to the embodiment is varied.

FIG. 6 is a graph showing average crystallite diameter of TiN (111) when the temperature of the annealing of the barrier metal (barrier metal without annealing) in the conventional silicon carbide semiconductor device and the silicon carbide semiconductor device according to the embodiment is varied. In FIG. 6, a vertical axis indicates the average crystallite diameter of TiN (111) in units of nm. A horizontal axis indicates the temperature of the annealing and thicknesses of the Ti film 21 and the TiN film 22. For example, "20/70 nm" indicates that the thickness of the Ti film 21 is 20 nm while the thickness of the TiN film 22 is 70 nm.

As depicted in FIG. 6, when the annealing is performed in a range of 550 degrees C. to 650 degrees C., the average crystallite diameter of TiN is in a range of 12 nm to 16 nm. Further, while not depicted, when the annealing is performed in a range of 550 degrees C. to 750 degrees C., the average crystallite diameter of TiN (111) is in a range of 12 nm to 18 nm. By increasing the crystallite diameter as described, the growth of the grain boundary 25 may be inhibited in the TiN film 22, in a direction from the surface of the TiN film 22 to the bottom of in the TiN film 22, whereby the grain boundary 25 may be prevented from penetrating to the bottom of the TiN film 22.

As described, in the embodiment, the grain boundary 25 of the barrier metal (annealed barrier metal) 20 serves as a path of the Ni of the underlying ohmic electrode 13 containing NiSi, and since the grain boundary 25 is blocked, the barrier property of the barrier metal 20 is enhanced. The barrier property is enhanced and thus, Ni of the ohmic electrodes 13 may be prevented from passing through the barrier metal 20 and seeping into the source electrode pad 15, which is constituted by an Al film or an Al—Si film.

Figure 7:
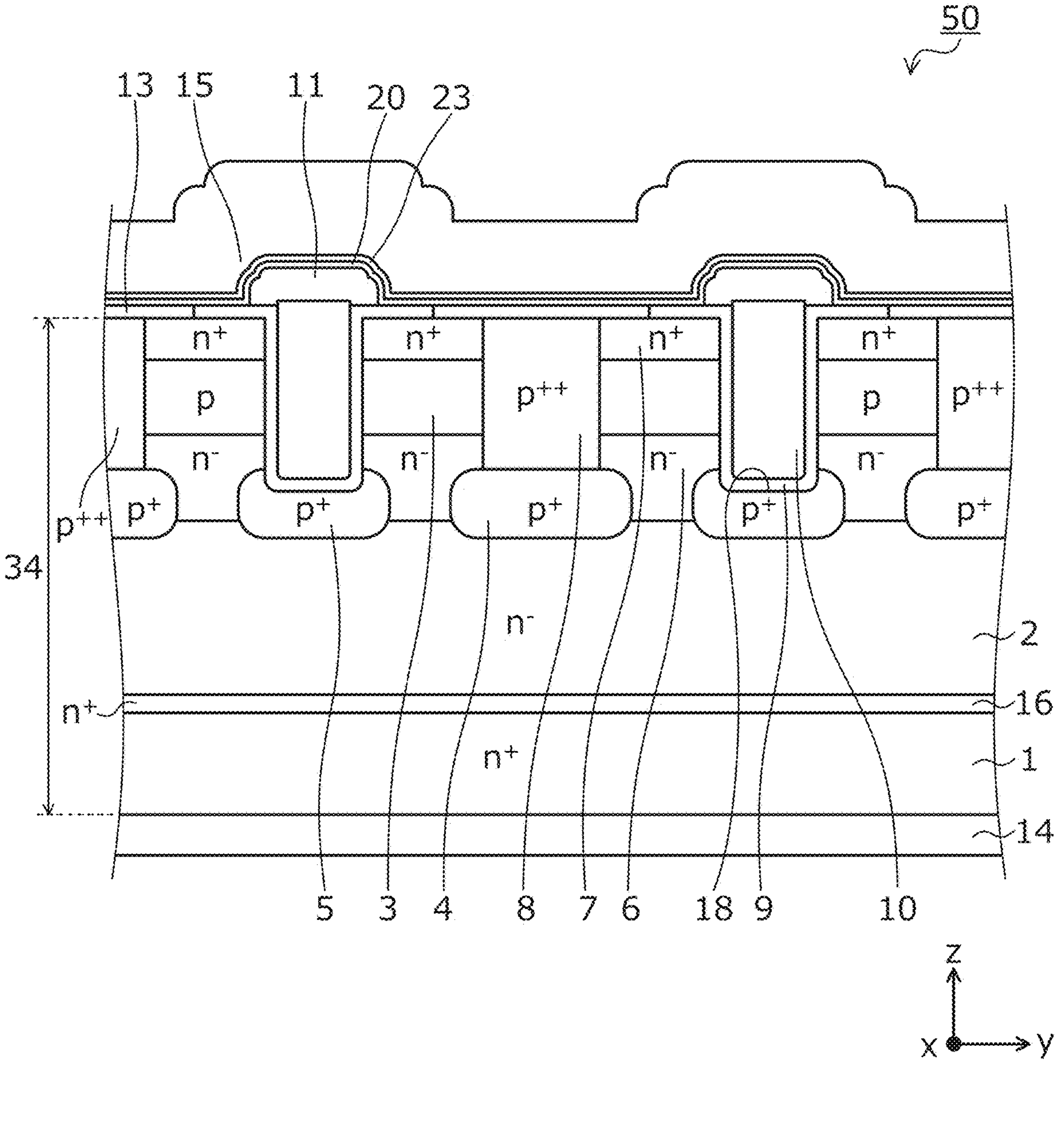
FIG. 7 is a cross-sectional view depicting another configuration of the silicon carbide semiconductor device according to the embodiment.

FIG. 7 is a cross-sectional view depicting another configuration of the silicon carbide semiconductor device according to the embodiment. As depicted in FIG. 7, between the barrier metal 20 and the source electrode pad 15, a second TiN film 23 may be provided. Further, preferably, the second TiN film 23 may be thinner than the barrier metal 20. By depositing the second TiN film 23 after the formation of the barrier metal 20, the second TiN film 23 is not annealed. Therefore, the average crystallite diameter of TiN (111) in the second TiN film 23 is less than 12 nm and is, thus, smaller than the average crystallite diameter of TiN (111) in the barrier metal 20. The second TiN film 23 may further enhance the barrier property of the barrier metal 20.

Figure 8:
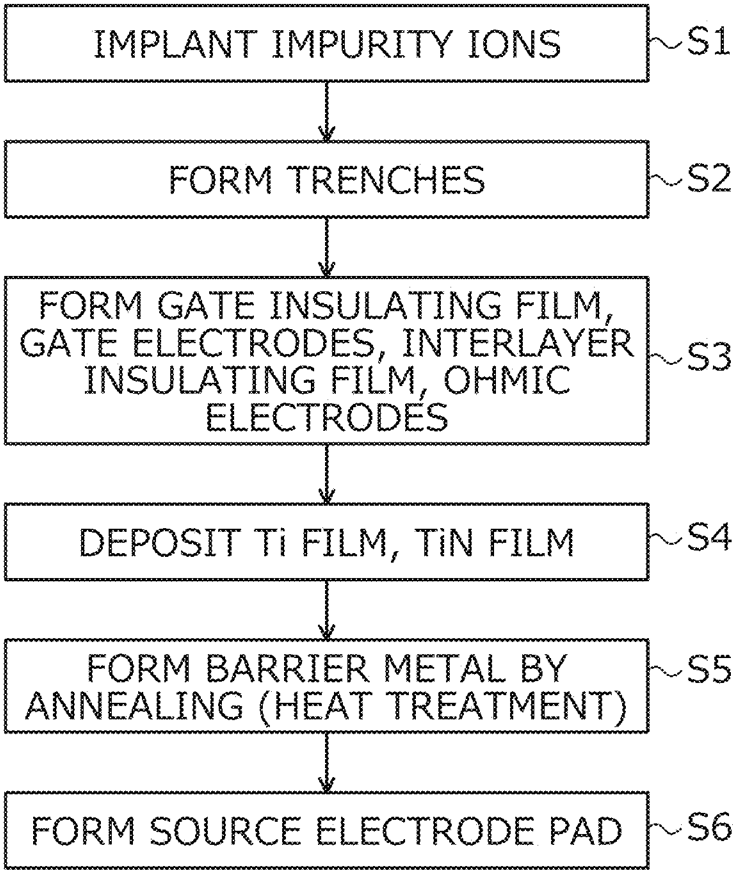
FIG. 8 is a flowchart depicting an outline of a method of manufacturing the silicon carbide semiconductor device according to the embodiment.

Next, a method of manufacturing the silicon carbide semiconductor device according to the embodiment is described. FIG. 8 is a flowchart depicting an outline of the method of manufacturing the silicon carbide semiconductor device according to the embodiment. FIGS. 9, 10, 11, and 12 are cross-sectional views schematically depicting states of the silicon carbide semiconductor device according to the embodiment during manufacture.

First, a silicon carbide semiconductor substrate (silicon carbide semiconductor substrate of the first conductivity type) 34 in which the first $n^-$-type silicon carbide epitaxial layer 2 and the $n^+$-type buffer layer 16 are deposited on the $n^+$-type starting substrate 1 containing an n-type silicon carbide is prepared (refer to FIG. 1) (first process). The silicon carbide semiconductor substrate 34 may be purchased, or the $n^+$-type starting substrate 1 alone may be purchased and the $n^+$-type buffer layer 16 and the first $n^-$-type silicon carbide epitaxial layer 2 may be grown by epitaxy, thereby forming the described silicon carbide semiconductor substrate 34. In this instance, on the first main surface of the $n^+$-type starting substrate 1, the $n^+$-type buffer layer 16 containing silicon carbide is grown by epitaxy while an n-type impurity, for example, nitrogen (N) atoms, is doped. Next, on the $n^+$-type buffer layer 16, the first $n^-$-type silicon carbide epitaxial layer 2 containing silicon carbide is grown while an n-type impurity, for example, nitrogen atoms, is doped.

Next, impurity ions are selectively implanted at the surface of the silicon carbide semiconductor substrate 34 (step S1: second process). As a result, impurity regions (for example, the p-type base layer 3, the first $p^+$-type regions 4, the second $p^+$-type regions 5, the second $n^-$-type silicon carbide layer 6, the $n^+$-type source region 7, the $p^{++}$-type contact regions 8, etc.) are formed in the silicon carbide semiconductor substrate 34. The impurity regions are formed as follows.

First, on the surface of the first $n^-$-type silicon carbide epitaxial layer 2, a non-depicted resist mask having predetermined openings is formed by photolithography. Subsequently, a p-type impurity, for example, aluminum atoms, is implanted by an ion implantation method, thereby forming in the first $n^-$-type silicon carbide epitaxial layer 2, the first $p^+$-type regions 4 and the second $p^+$-type regions 5, each having a thickness of about 0.6 μm and an impurity concentration in a range of, for example, $1\times10^{18}/cm^3$ to $5\times10^{18}/cm^3$.

Next, on the surface of the first $n^-$-type silicon carbide epitaxial layer 2, a non-depicted resist mask having a predetermined opening is formed by photolithography. Subsequently, the second $n^-$-type silicon carbide layer 6 doped with an n-type impurity such as nitrogen and having an impurity concentration in a range of, for example, $1\times10^{17}/cm^3$ to $3\times10^{17}/cm^3$ and a thickness of about 0.7 μm is formed by an ion implantation method. The second $n^-$-type silicon carbide layer 6 may be formed on the surface of the first $n^-$-type silicon carbide epitaxial layer 2 by epitaxial growth.

Next, on the surface of the first $n^-$-type silicon carbide epitaxial layer 2, a non-depicted resist mask having a predetermined opening is formed by photolithography. Subsequently, the p-type base layer 3 having a thickness of about 0.5 μm and an impurity concentration in a range of, for example, $1\times10^{17}/cm^3$ to $5\times10^{17}/cm^3$ is formed by an ion implantation method. The p-type base layer 3 may be formed on the surface of the second $n^-$-type silicon carbide layer 6 by epitaxial growth.

Next, on the surface of the p-type base layer 3, a non-depicted resist mask having a predetermined opening is formed by photolithography. Subsequently, an $n^+$-type source region 7 having a thickness of about 0.5 μm and an impurity concentration in a range of, for example, $1\times10^{19}/cm^3$ to $3\times10^{19}/cm^3$ is formed by an ion implantation method.

Figure 9:
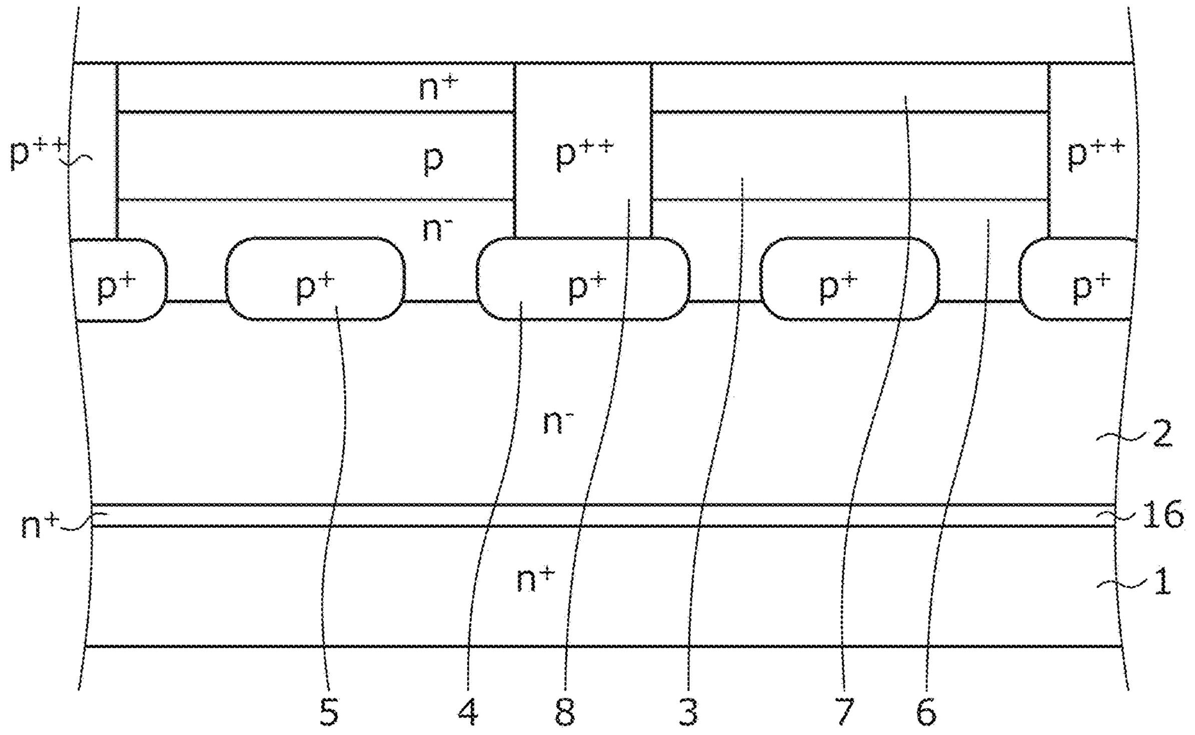
FIG. 9 is a cross-sectional view schematically depicting a state of the silicon carbide semiconductor device according to the embodiment during manufacture.

Next, an ion implantation mask having predetermined openings is formed, in portions of the $n^+$-type source region 7 and portions of the p-type base layer 3, a p-type impurity such as aluminum is ion-implanted, thereby forming the $p^{++}$-type contact regions 8 having an impurity concentration in a range of, for example, $1\times10^{20}/cm^3$ to $3\times10^{20}/cm^3$. The state up to here is depicted in FIG. 9.

Next, a heat treatment is performed under an inert gas atmosphere at a temperature of about 1750 degrees C., thereby implementing an activation process for the impurity regions formed by ion implantation. The ion implanted regions may be activated collectively by a single session of the heat treatment or may be activated by performing the heat treatment each time ion implantation is performed.

Figure 10:
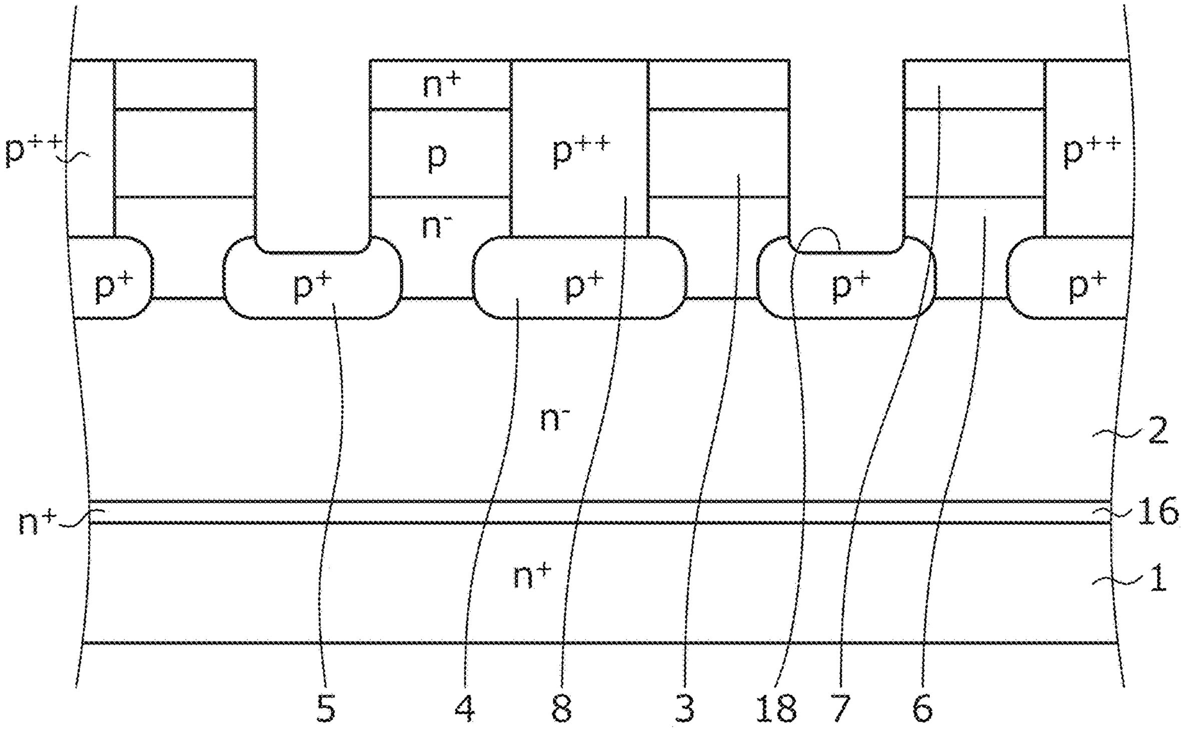
FIG. 10 is a cross-sectional view schematically depicting a state of the silicon carbide semiconductor device according to the embodiment during manufacture.

Next, on the surface of the $n^+$-type source region 7, a trench forming mask having predetermined openings is formed by photolithography using, for example, an oxide film. The trenches 18, which penetrate through the $n^+$-type source region 7 and the p-type base layer 3 and reach the second $p^+$-type regions 5, are formed by dry etching (step S2). Next, the trench forming mask is removed. The state up to here is depicted in FIG. 10.

After the trenches 18 are formed, isotropic etching for removing damage of the trenches 18 and sacrificial oxidation for rounding corners of the bottoms and openings of the trenches 18 may be performed. Either the isotropic etching or the sacrificial oxidation alone may be performed. Further, the isotropic etching may be performed and thereafter, the sacrificial oxidation may be performed. As a result, the silicon carbide may have a clean surface and the corners are rounded, whereby concentration of electric field at the bottoms and the openings of the trenches 18 may be suppressed.

Next, the gate insulating film 9, the gate electrodes 10, the interlayer insulating film 11, and the ohmic electrodes 13 are formed (step S3: third process). These parts are formed as follows. Along the surfaces of the $n^+$-type source region 7 and the $p^{++}$-type contact regions 8 and the bottoms and sidewalls of each of the trenches 18, the gate insulating film 9 is formed. The gate insulating film 9 may be formed by thermal oxidation at a temperature of about 1300 degrees C. under a gas atmosphere containing oxygen. Further, the gate insulating film 9 may be formed by a deposition method by a chemical reaction such as that for a high temperature oxide (HTO).

Next, on the gate insulating film 9, for example, a polycrystalline silicon layer doped with phosphorus atoms is provided. The polycrystalline silicon layer may be formed so as to be embedded in the trenches 18. The polycrystalline silicon layer is patterned by photolithography and portions thereof are left in the trenches 18, thereby forming the gate electrodes 10.

Next, an insulating film is formed at the surfaces of the gate electrodes 10. For example, annealing under an oxygen atmosphere of 1000 degrees C. is performed, thereby forming a thermal oxide film. Next, the surface is protected by, for example, a photoresist. Next, the insulating film, gate electrodes (polycrystalline silicon layer), and gate insulating film formed at the back surface are all removed by dry etching. Next, by an ashing/peeling process, the protective film formed at the surface is removed. Here, ashing in an oxygen plasma and peeling by SPM were performed.

Next, for example, a phosphate glass having a thickness of about 1 μm is deposited so as to cover the gate insulating film 9 and the gate electrodes 10, thereby forming the interlayer insulating film 11. Next, the interlayer insulating film 11 and the gate insulating film 9 are patterned by photolithography, thereby forming contact holes exposing the $n^+$-type source region 7 and the $p^{++}$-type contact regions 8. Next, in the contact holes and on the interlayer insulating film 11, a conductive film constituting the ohmic electrodes 13 is deposited by, for example, sputtering. Next, a heat treatment of about 1000 degrees C. is performed, thereby selectively causing the conductive film and the silicon carbide to react and thereafter, unreacted portions of the conductive film are selectively removed, thereby leaving only the ohmic electrodes 13 in the contact holes, the ohmic electrodes 13 being in contact with the $n^+$-type source region 7 and the $p^{++}$-type contact regions 8.

Figure 11:
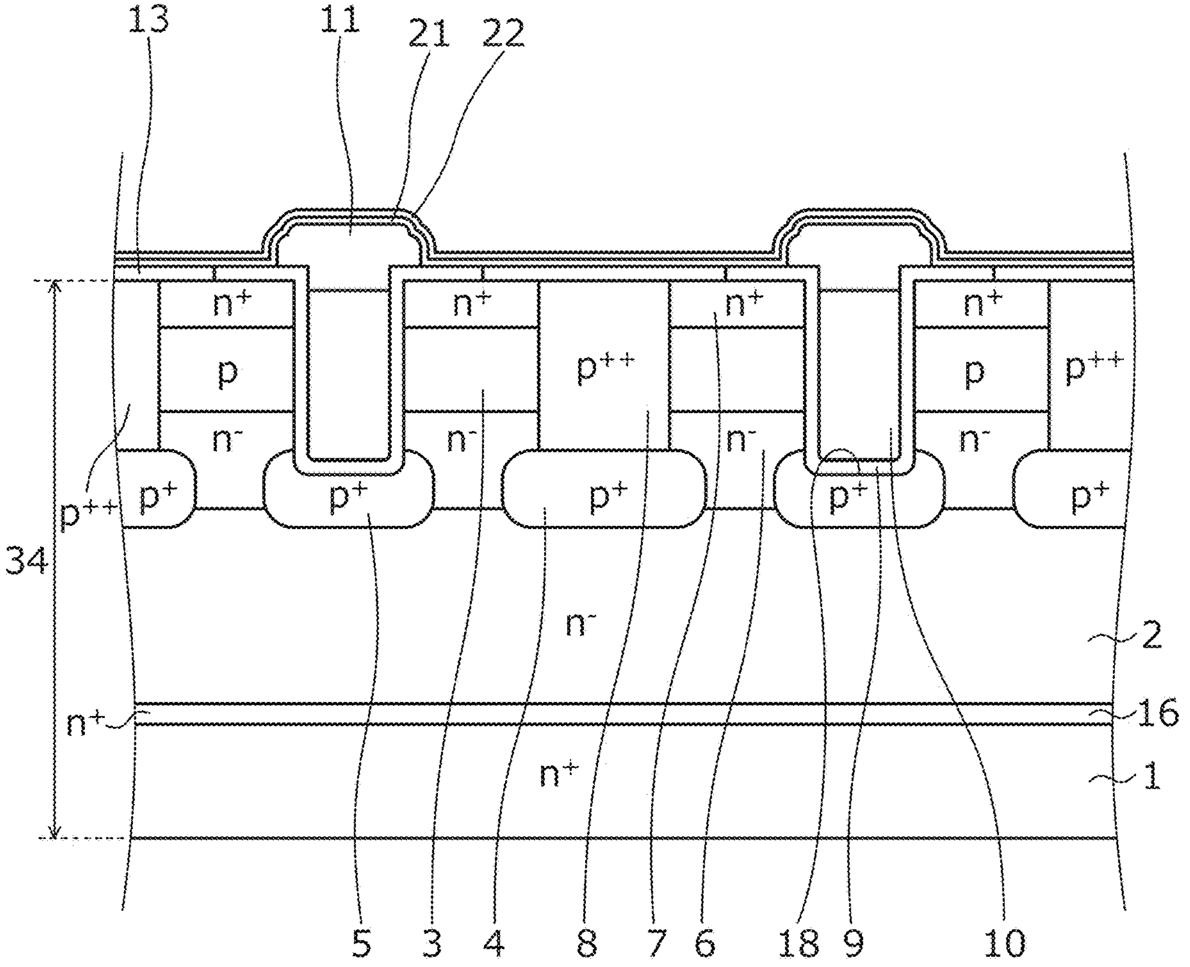
FIG. 11 is a cross-sectional view schematically depicting a state of the silicon carbide semiconductor device according to the embodiment during manufacture.

Next, the Ti film 21 and the TiN film 22 are deposited in the order stated (step S4: fourth process). At the surfaces of the ohmic electrodes 13 and the interlayer insulating film 11, the Ti film 21 is deposited and thereafter, at the surface of the Ti film 21, the TiN film 22 is deposited. For example, the Ti film 21 has a thickness in a range of 10 nm to 100 nm while the TiN film 22 has a thickness in a range of 50 nm to 200 nm. The state up to here is depicted in FIG. 11.

Figure 12:
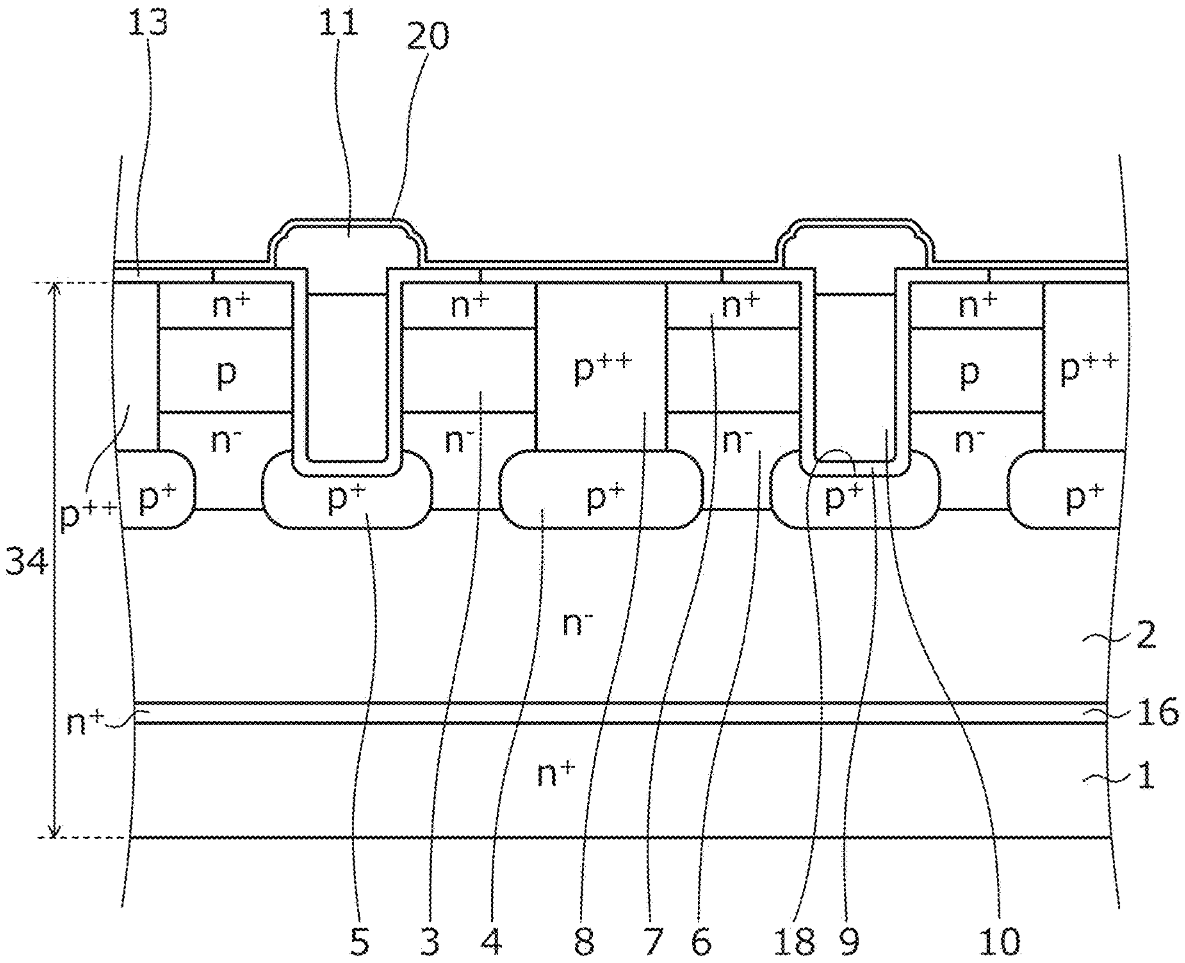
FIG. 12 is a cross-sectional view schematically depicting a state of the silicon carbide semiconductor device according to the embodiment during manufacture.

Next, the Ti film 21 and the TiN film 22 are annealed (subjected to a heat treatment), thereby forming the barrier metal (annealed barrier metal) 20 (step S5: fifth process). For example, the Ti film 21 and the TiN film 22 are annealed in a vertical furnace. Preferably, the annealing treatment may be performed under conditions including being performed under an argon (Ar) or $N_2$ atmosphere, at a temperature in a range of 550 degrees C. 750 degrees C., for at least 5 to not more than 20 minutes. The temperature of the annealing treatment has to be lower than about 1000 degrees C., which is the temperature of the heat treatment when the ohmic electrodes 13 are formed. The state up to here is depicted in FIG. 12. By the heat treatment, as depicted in FIG. 3, the columnar structure of the barrier metal 20 becomes random and as depicted in FIG. 6, the average crystallite diameter of TIN (111) of the barrier metal 20 is in a range of 12 nm to 18 nm. After the annealing treatment, at the surface of the TiN film 22, the second TiN film 23, which has a thickness less than the thickness of the Ti film 21, may be formed.

Next, for example, on the barrier metal 20, a metal film constituting the source electrode pad 15 is formed by, for example, a sputtering method. For example, by DC magnetron sputtering deposition equipment, an Al—Si film is deposited. Conditions of the sputtering method include a gas being Ar, pressure of the gas being in a range of 0.1 Pa to 1.0 Pa, a wafer heating temperature being in a range of 300 degrees C. to 450 degrees C., a DC sputtering power being 12 kW, a deposition time being adjusted so that the thickness of the film is in a range of 3 μm to 7 μm.

A portion of an electrode pad is on the interlayer insulating film 11 and a thickness of the portion may be, for example, 5.5 μm. The electrode pad may be formed containing, for example, aluminum that contains 1% of silicon (Al—Si). Next, the metal film is selectively removed, thereby forming the source electrode pad 15 (step S6: sixth process).

Next, the front surface of the $n^+$-type starting substrate 1 is covered and protected by a protective film (not depicted), thereafter, the $n^+$-type starting substrate 1 may be ground from the back surface, whereby the $n^+$-type starting substrate 1 may be reduced in thickness to have a product thickness.

Next, on the second main surface of the $n^+$-type starting substrate 1, a conductive film constituting the drain electrode (not depicted) is formed by, for example, successively depositing a molybdenum film and a nickel film by, for example, a sputtering method. Thereafter, for example, a heat treatment such as laser annealing is performed, causing the $n^+$-type starting substrate 1 and the conductive film to react with each other and form an ohmic contact, whereby the drain electrode is formed.

Next, at the surface of the drain electrode, for example, titanium, nickel, and gold are deposited in the order stated, as the drain electrode pad 14 (seventh process). As described, the silicon carbide semiconductor device depicted in FIG. 1 is completed.

As described, according to the embodiment, after the Ti film and the TiN film are deposited in the stated order, the Ti film and the TiN film are heat treated, thereby forming the annealed barrier metal. As a result, the columnar structure of the annealed barrier metal is random, the crystallite diameter increases, and in the TiN film, growth of the grain boundary in a direction from the surface to the bottom of the TiN film may be hindered, whereby the grain boundary may be prevented from penetrating through to the bottom of the TiN film. The grain boundary, which serves as a path of the Ni of the ohmic electrodes containing NiSi is blocked and thus, the barrier property of the annealed barrier metal is enhanced. The barrier property is enhanced, whereby Ni of the ohmic electrodes may be prevented from passing through the annealed barrier metal and seeping into the source electrode pad, which is constituted by an Al film or an Al—Si film.

In the foregoing, the present invention may be variously modified within a range not departing from the spirit of the invention and in the embodiments, for example, dimensions, impurity concentrations, etc. of regions may be variously set according to necessary specifications. In the embodiments, while a trench-type MOSFET is described as an example, application is further possible to a planar MOSFET and to various types of semiconductor devices such as insulated gate bipolar transistors (IGBTs), diodes, and the like. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the present invention described above, after the Ti film and the TiN film are deposited in the order stated, the barrier metal (annealed barrier metal) is formed by performing a heat treatment on the Ti film and TiN film. As a result, the columnar structure of the annealed barrier metal becomes random, the crystallite diameter increases, and in the TiN film, growth of the grain boundary in a direction from the surface to the bottom of the TiN film may be hindered, whereby the grain boundary may be prevented from penetrating through to the bottom of the TiN film. The grain boundary, which serves as a path of the Ni of the ohmic electrodes containing NiSi, is blocked and thus, the barrier property of the barrier metal is enhanced. The barrier property is enhanced, whereby Ni of the ohmic electrodes may be prevented from passing through the barrier metal and seeping into the source electrode pad, which is constituted by an Al film or an Al—Si film.

The method of manufacturing a silicon carbide semiconductor device and the silicon carbide semiconductor device according to the present invention achieve an effect in that the barrier property of the barrier metal is enhanced, whereby the Ni of the ohmic electrodes may be prevented from passing through the barrier metal and seeping into the Al film or the Al—Si film.

As described, the method of manufacturing a silicon carbide semiconductor device and the silicon carbide semiconductor device according to the present invention are useful for power semiconductor devices used in power converting equipment such as inverters, power source devices of various industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:

preparing a silicon carbide semiconductor substrate having a first main surface and a second main surface opposite to each other, the silicon carbide semiconductor substrate having:

a starting substrate of a first conductivity type, the starting substrate having a first surface and a second surface opposite to each other, the second surface constituting the second main surface of the silicon carbide semiconductor substrate, and a first semiconductor layer of the first conductivity type, provided at the first surface of the starting substrate and having an impurity concentration lower than an impurity concentration of the starting substrate, the first semiconductor layer having a first surface and a second surface opposite to each other, the second surface of the first semiconductor layer facing the starting substrate;

forming a second semiconductor layer of a second conductivity type, at the first surface of the first semiconductor layer;

forming an ohmic electrode at a surface of the second semiconductor layer;

forming a barrier metal by depositing a titanium (Ti) film and subsequently a titanium nitride (TiN) film at a surface of the ohmic electrode;

performing a heat treatment on the barrier metal at a temperature in a range of 550 degrees C. to 750 degrees C. to form an annealed barrier metal;

forming a surface electrode at a surface of the annealed barrier metal; and forming a back electrode at the second main surface of the silicon carbide semiconductor substrate.

2. The method according to claim 1, further comprising forming a second TIN film at the surface of the annealed barrier metal after the heat treatment on the barrier metal is performed but before forming the surface electrode, wherein forming the surface electrode includes forming the surface electrode at a surface of the second TiN film.

3. The method according to claim 1, wherein depositing the Ti film and the TIN film includes depositing the Ti film having a thickness in a range of 10 nm to 100 nm and the TiN film having a thickness of in a range of 50 nm to 200 nm.

4. The method according to claim 1, wherein forming the annealed barrier metal includes performing the heat treatment under an inert gas atmosphere or a nitrogen (N) atmosphere.

5. A silicon carbide semiconductor device, comprising:

a silicon carbide semiconductor substrate having a first main surface and a second main surface opposite to each other, the silicon carbide semiconductor substrate having:

a starting substrate of a first conductivity type, the starting substrate having a first surface and a second surface opposite to each other, the second surface constituting the second main surface of the silicon carbide semiconductor substrate, and a first semiconductor layer of the first conductivity type, provided at the first surface of the starting substrate and having an impurity concentration lower than an impurity concentration of the starting substrate, the first semiconductor layer having a first surface and a second surface opposite to each other, the second surface of the first semiconductor layer facing the starting substrate;

a second semiconductor layer of a second conductivity type, provided at the first surface of the first semiconductor layer;

an ohmic electrode provided at a surface of the second semiconductor layer;

a barrier metal provided at a surface of the ohmic electrode, the barrier metal being constituted by a TiN film and having a region in which a concentration of N decreases in a thickness direction from the first main surface toward the second main surface of the silicon carbide semiconductor substrate while a concentration of Ti is uniform;

a surface electrode provided at a surface of the barrier metal; and a back electrode provided at the second main surface of the silicon carbide semiconductor substrate.

6. The silicon carbide semiconductor device according to claim 5, further comprising a second TiN film provided between the barrier metal and the surface electrode, wherein the second TiN film has an average crystallite diameter that is smaller than an average crystallite diameter of the barrier metal.

7. The silicon carbide semiconductor device according to claim 5, wherein a grain boundary in a direction from the surface of the barrier metal to a bottom of the barrier metal does not penetrate to the bottom.

8. The silicon carbide semiconductor device according to claim 5, wherein the TiN film has an average crystallite diameter in a range of 12 nm to 18 nm.

9. The silicon carbide semiconductor device according to claim 5, wherein the ohmic electrode contains a nickel-silicide (NiSi).

10. The silicon carbide semiconductor device according to claim 5, wherein the surface electrode contains aluminum (Al) or aluminum-silicon (Al—Si).

* * * * *